United States Patent
Lin

(10) Patent No.: US 11,303,271 B2
(45) Date of Patent: *Apr. 12, 2022

(54) FILTERING CIRCUIT FOR PULSE WIDTH MODULATED SIGNAL

(71) Applicant: STMicroelectronics (Shenzhen) R&D Co. Ltd., Shenzhen (CN)

(72) Inventor: Hong Wu Lin, Shenzhen (CN)

(73) Assignee: STMicroelectronics (Shenzhen) R&D Co. Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/991,126

(22) Filed: Aug. 12, 2020

(65) Prior Publication Data

US 2021/0135660 A1 May 6, 2021

Related U.S. Application Data

(63) Continuation of application No. 16/669,154, filed on Oct. 30, 2019, now Pat. No. 10,749,515.

(51) Int. Cl.
| | |
|---|---|
| *H03K 7/08* | (2006.01) |
| *H04L 27/20* | (2006.01) |
| *H03F 3/217* | (2006.01) |

(52) U.S. Cl.
CPC .............. *H03K 7/08* (2013.01); *H04L 27/20* (2013.01); *H03F 3/2175* (2013.01)

(58) Field of Classification Search
CPC ....................................................... H03K 7/08
USPC ............................................................ 332/109
See application file for complete search history.

(56) References Cited

U.S. PATENT DOCUMENTS

| | | | |
|---|---|---|---|
| 5,432,693 A | 7/1995 | Anderson | |
| 7,852,156 B1 | 12/2010 | Chen et al. | |
| 10,341,596 B1* | 7/2019 | Liu | ........... H04N 5/378 |
| 2005/0162571 A1* | 7/2005 | Marshall | ............... H04N 9/3123 |
| | | | 348/743 |
| 2018/0097443 A1* | 4/2018 | Couleur | ................... H02M 3/07 |

* cited by examiner

*Primary Examiner* — Joseph Chang
(74) *Attorney, Agent, or Firm* — Slater Matsil, LLP

(57) ABSTRACT

A filtering circuit for filtering a pulse width modulated (PWM) signal includes a D flip-flop having an input terminal configured to be coupled to a logic high signal and having an output terminal coupled to an output terminal of the filtering circuit; and a circuit coupled between an input terminal of the filtering circuit and the D flip-flop, the circuit configured to, for a first pulse of the PWM signal having a duty cycle within a pre-determined range: generate a positive pulse at a clock terminal of the D flip-flop as a clock signal of the D flip-flop; and generate a negative pulse at a reset terminal of the D flip-flop as a reset signal of the D flip-flop, wherein a duration between a rising edge of the positive pulse and a falling edge of the negative pulse is equal to a duration of the first pulse of the PWM signal.

19 Claims, 6 Drawing Sheets

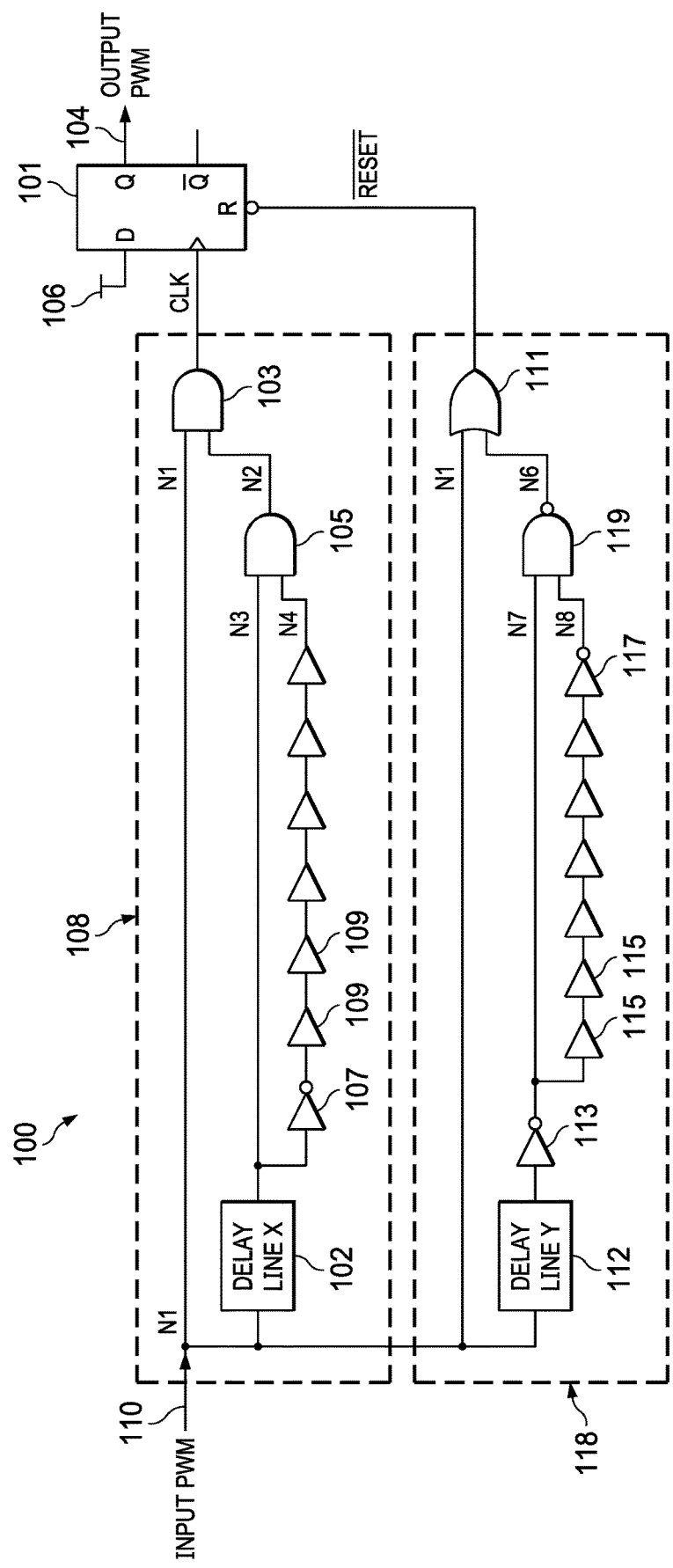
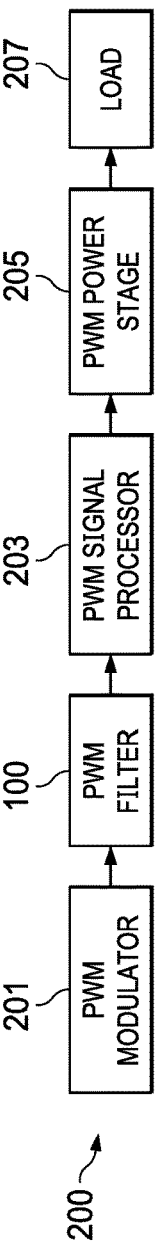
FIG. 1
FIG. 2

FILTERING CIRCUIT FOR PULSE WIDTH MODULATED SIGNAL

PRIORITY CLAIM AND CROSS-REFERENCE

This application is a continuation of U.S. patent application Ser. No. 16/669,154, filed on Oct. 30, 2019, and entitled "Filtering Circuit for Pulse Width Modulated Signal," which application is incorporated herein by reference.

TECHNICAL FIELD

The present invention relates generally to a digital filtering circuit, and, in particular embodiment, to a digital filtering circuit for filtering a pulse width modulated (PWM) signal.

BACKGROUND

Pulse width modulated (PWM) signals are commonly used in electrical and electronic systems. By changing (e.g., modulating) the duty cycles of, e.g., a sequence of periodic square waves of the PWM signal, information can be carried in the varying duty cycles of the waveforms. PWM signals may be used to carrier control signals or digital information (e.g., speed/audio information) in a wide variety of systems, such as control systems, power systems, audio systems, or the like. The waveforms in a PWM signal may also be referred to as square wavers or pulses herein, and the PWM signal is said to comprise a plurality of pulses (or a plurality of square waves).

In some applications, such as high frequency class-D amplifier applications, the PWM signals generated by the PWM modulator may have pulses with duty cycles outside a pre-determined range, wherein the pre-determined range may be, e.g., between about 2% and about 98%. For example, some pulses may have duty cycles that are too high (e.g., larger than about 98%) or too low (e.g., less than 2%). Pulses with duty cycles outside the pre-determined range may cause problem for subsequent processing in the system. For example, pulses with too low of a duty cycle may fail to set or reset registers properly in a digital system, which may result in an error in the output level of the system. Therefore, it may be advantageous to filter the pulses of the PWM signal to remove pulses having duty cycles outside the pre-determined range.

Challenges exist in the design of a filtering circuit for the PWM signal. For example, a simple RC filter may not be able to remove all pulses in the PWM signal that have duty cycles outside the pre-determined range. In addition, the RC filter may introduce distortions into the filtered pulses, thereby distorting the shape of the pulses (e.g., changing the width of the pulse). For applications such as high frequency class-D amplifier applications, distortion in the filtered pulses of the PWM signal may seriously degrade the system performance. Therefore, there is a need in the art for a filtering circuit that can reliably remove pulses of a PWM signal that have duty cycles outside a pre-determined range while introducing little or no distortion to the filtered pulses.

SUMMARY

In some embodiments, a filtering circuit for filtering a pulse width modulated (PWM) signal includes a D flip-flop having an input terminal configured to be coupled to a logic high signal and having an output terminal coupled to an output terminal of the filtering circuit; and a circuit coupled between an input terminal of the filtering circuit and the D flip-flop, the circuit configured to, for a first pulse of the PWM signal having a duty cycle within a pre-determined range: generate a positive pulse at a clock terminal of the D flip-flop as a clock signal of the D flip-flop; and generate a negative pulse at a reset terminal of the D flip-flop as a reset signal of the D flip-flop, wherein a duration between a rising edge of the positive pulse and a falling edge of the negative pulse is equal to a duration of the first pulse of the PWM signal.

In some embodiments, a filtering circuit for filtering a pulse width modulated (PWM) signal, the filtering circuit includes: a D flip-flop and a first circuit coupled between an input terminal of the filtering circuit and an input clock terminal of the D flip-flop, wherein the first circuit comprises: a first delay line; a first inverter; a first AND gate; and a second AND gate, wherein the first delay line is coupled between the input terminal of the filtering circuit and the first inverter, the first inverter is coupled between the first delay line and a first input of the first AND gate, and a second input of the first AND gate is coupled to an output of the first delay line, wherein a first input of the second AND gate is coupled to the input terminal of the filtering circuit, a second input of the second AND gate is coupled to an output of the first AND gate, and an output of the second AND gate is coupled to the input clock terminal of the D flip-flop. The filtering circuit further includes a second circuit coupled between the input terminal of the filtering circuit and a reset terminal of the D flip-flop, wherein the second circuit comprises: a second delay line; a second inverter; a third inverter; an NAND gate; and an OR gate, wherein the second delay line is coupled between the input terminal of the filtering circuit and the second inverter, the third inverter is coupled between the second inverter and a first input of the NAND gate, and a second input of the NAND gate is coupled to an output of the second inverter, wherein a first input of the OR gate is coupled to the input terminal of the filtering circuit, a second input of the OR gate is coupled to an output of the NAND gate, and an output of the OR gate is coupled to the reset terminal of the D flip-flop.

In some embodiments, a method of filtering a pulse width modulated (PWM) signal, the method includes: applying a logic high signal to an input terminal of a D flip-flop; processing a first pulse of the PWM signal using a first circuit and a second circuit to generate a clock signal and a reset signal, respectively, wherein the first pulse has a duty cycle within a pre-determined range, wherein the clock signal is a positive pulse, and the reset signal is a negative pulse; and sending the clock signal and the reset signal to a clock terminal and a reset terminal of the D flip-flop, respectively.

BRIEF DESCRIPTION OF THE DRAWINGS

The details of one or more embodiments of the invention are set forth in the accompanying drawings and the description below. Other features, objects, and advantages of the invention will be apparent from the description and drawings, and from the claims. In the figures, identical reference symbols generally designate the same component parts throughout the various views, which will generally not be re-described in the interest of brevity. For a more complete understanding of the invention, reference is now made to the following descriptions taken in conjunction with the accompanying drawings, in which:

FIG. 1 illustrates a schematic view of a filtering circuit for filtering a PWM signal, in an embodiment;

FIG. 2 illustrates a functional block diagram of a power system using the filtering circuit of FIG. 1, in an embodiment;

DETAILED DESCRIPTION OF ILLUSTRATIVE EMBODIMENTS

Figure 3:
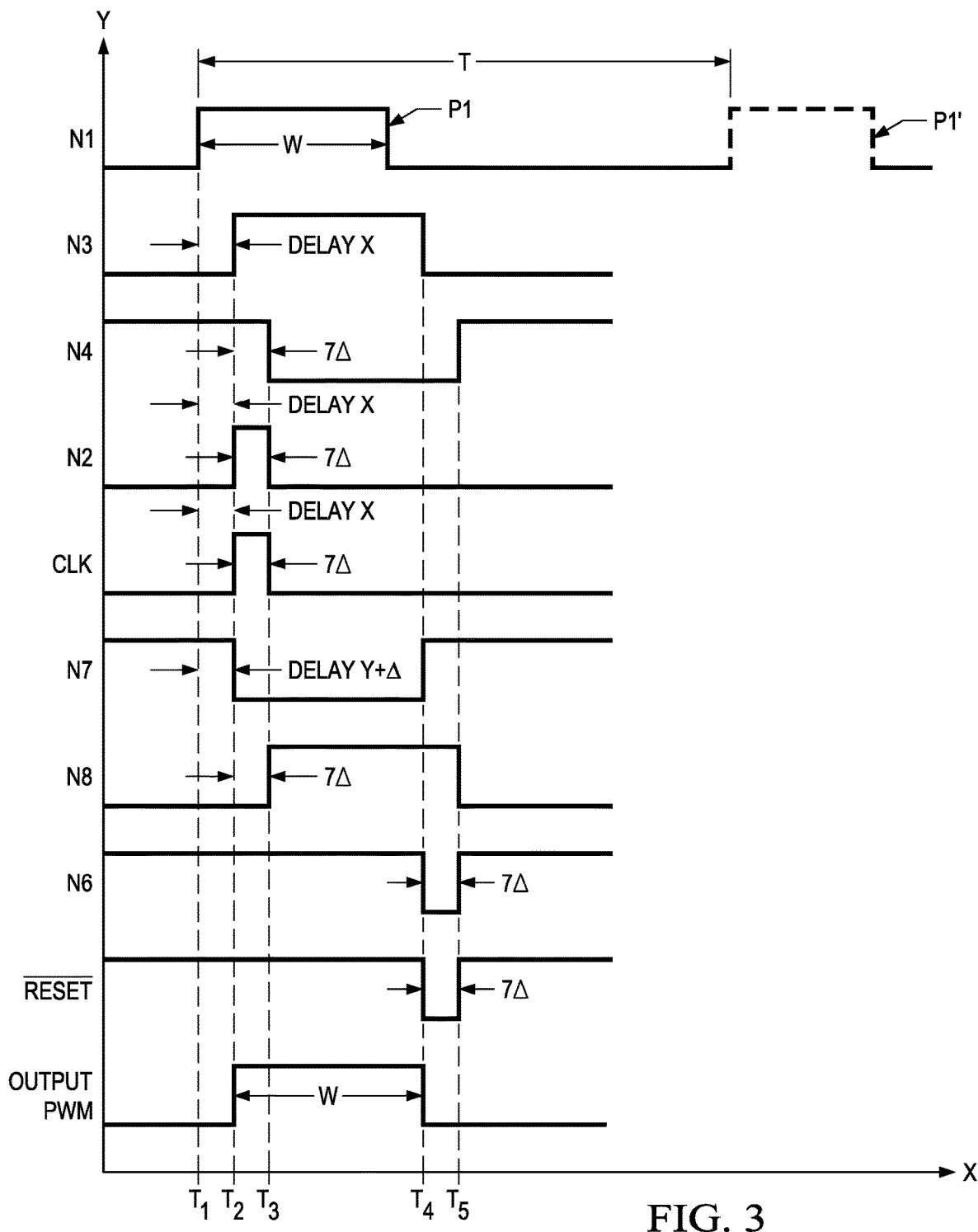
FIG. 3 is a timing diagram illustrating the filtering of a positive pulse by the filtering circuit of FIG. 1, in an embodiment.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely a filtering circuit for filtering a PWM signal to remove pulses of the PWM signal having duty cycles outside a pre-determined range.

FIG. 1 illustrates a schematic view of a filtering circuit 100 (may also be referred to as a PWM filter) for filtering a PWM signal, in an embodiment. The filtering circuit 100 in FIG. 1 includes a D flip-flop 101, a first circuit 108, and a second circuit 118. The input terminal D of the D flip-flop 101 is configured to be coupled to a logic high signal 106, e.g., a logic high voltage level, such as +3V, or +5V. The first circuit 108 is coupled between an input terminal 110 of the filtering circuit 100 and a clock terminal (also referred to as an input clock terminal) of the D flip-flop 101, which clock terminal is connected to a clock signal CLK. The second circuit 118 is coupled between the input terminal 110 and a reset terminal R of the D flip-flop. The output terminal Q of the D flip-flop 101 is the output terminal 104 of the filtering circuit 100. In the example of FIG. 1, the clock signal of the D flip-flop 101 has an effective rising-edge, and the reset signal of the D flip-flop is a low-effective signal. In other words, the output at the output terminal Q of the D flip-flop 101 changes at the rising-edge of the clock signal CLK, and the D flip-flop is reset (e.g., output a logic low value) when a logic low voltage level (e.g., 0V) is applied at the reset terminal R.

In FIG. 1, the first circuit 108 processes (e.g., filters) a PWM signal at the input terminal 110 and produces the clock signal CLK at an output of the first circuit 108. The second circuit 118 processes (e.g., filters) the PWM signal at the input terminal 110 and produces the reset signal $\overline{Reset}$ at an output of the second circuit 118. The D flip-flop 101, with the input terminal D coupled to a logic high signal and under the control of the clock signal CLK and the reset signal $\overline{Reset}$, produces a filtered PWM signal at the output terminal Q. The filtered PWM signal (also referred to as output PWM signal) includes a plurality of pulses having duty cycles within a pre-determined range (e.g., between 2% and 98%), where each of the plurality of pulses in the output PWM signal corresponds to a respective pulse in the PWM signal (also referred to as the input PWM signal) at the input terminal 110. In addition, pulses in the input PWM signal having duties cycles outside the pre-determined range are filtered out (e.g., removed), such that the output PWM signal does not have pulses with duty cycles outside the pre-determined range. In other words, the output PWM signal otherwise resembles (e.g., is substantially equal to) a delayed version of the input PWM signal, but with the pulses having duty cycles outside the pre-determined range removed. Details regarding the filtering operation of the filtering circuit 100 are discussed hereinafter with reference to FIGS. 3 and 4.

Still referring to FIG. 1, the first circuit 108 includes a delay line X 102, an inverter 107, a first AND gate 105, and a second AND gate 103. The first circuit 108 may additionally include one or more buffers 109 coupled in series between the inverter 107 and the first AND gate 105. The delay line X 102 may be a digital delay line having a pre-determined delay DelayX to generate a propagation delay between its input and output. The delay line X may be formed by digital components, e.g., an even number of inverters coupled in series to provide the pre-determined delay. The pre-determined delay DelayX may be, e.g., in the order of nanosecond (ns), tens of nanoseconds, or even microsecond (µs), such as about 10 ns, although other values are also possible.

As illustrated in FIG. 1, the inverter 107 is coupled between the output of the delay line X 102 and a first input of the first AND gate 105. FIG. 1 further illustrates a plurality of buffers 109 couples in series between the output of the inverter 107 and the first input of the first AND gate 105. The buffers 109 are used to adjust the width of the clock signal CLK (see discussion below with reference to FIGS. 3 and 4), in some embodiments. In the example of FIG. 1, six buffers 109 are illustrated as a non-limiting example. Other numbers of buffers 109, such as 0, 1, 2, 3, 4, 5, or more than 6, may be used without departing from the spirit of the current disclosure. A second input of the first AND gate 105 is coupled to the output of the delay line X 102.

The output of the first AND gate 105 is coupled to a first input of the second AND gate 103, and a second input of the second AND gate 103 is coupled to the input terminal 11o. The output of the second AND gate 103 is the output of the first circuit 108, and is coupled to the clock terminal of the D flip-flop 101.

Still referring to FIG. 1, the second circuit 118 includes a delay line Y 112 with a pre-determined delay DelayY, an inverter 113, an inverter 117, an NAND gate 119, and an OR gate 111. The second circuit 118 may additionally include one or more buffers 115 coupled in series between the inverter 113 and the inverter 117.

The delay line Y 112 may be similar to the delay line X 102. In some embodiments, the pre-determined delay DelayX and DelayY are adjusted to determine the pre-determined range for the duty cycles of pulses, where pulses with duty cycles within the pre-determined range are allowed to pass through the filtering circuit 100, and pulses with duty cycles outside the pre-determined range are filtered out (e.g., removed) from the output terminal 104 of the filtering circuit 100. Details of the filtering circuit 100 are discussed hereinafter with reference to FIGS. 3 and 4.

As illustrated in FIG. 1, the delay line Y 112 is coupled between the input terminal 110 and the inverter 113. The inverter 117 is coupled between the output of the inverter 113 and a first input of the NAND gate 119. A second input of the NAND gate 119 is coupled to an output of the inverter 113. FIG. 1 further illustrates a plurality of buffers 115 coupled in series between the inverter 113 and the inverter 117. The buffers 115 are used to adjust the width of the reset signal $\overline{\text{Reset}}$ (see discussion below with reference to FIGS. 3 and 4), in some embodiments. In the example of FIG. 1, six buffers 115 are illustrated as a non-limiting example. Other numbers of buffers 115, such as 0, 1, 2, 3, 4, 5, or more than 6, may be used without departing from the spirit of the current disclosure.

The output of the NAND gate 119 is coupled to a first input of the OR gate 11, and a second input of the OR gate is coupled to the input terminal 11o of the filtering circuit 100. An output of the OR gate 111 is the output of the second circuit 118, which is coupled to the reset terminal of the D flip-flop 101.

FIG. 2 illustrates a block diagram of a power system 200 using the filtering circuit 100 of FIG. 1, in an embodiment. The power system 200 may be, e.g., a class-D amplifier. Note that for simplicity, no all features of the power system 200 are illustrated in FIG. 2. The power system 200 includes a PWM modulator 201, a filtering filter 100 (also referred to as a PWM filter), a PWM signal processor 203, and a PWM power stage 205. FIG. 2 further illustrates a load 207 driven by the PWM power stage 205, where the load 207 may not be a part of the power system 200.

The PWM modulator 201 generates a PWM signal. The PWM signal may be generated in different ways, such as in phase, out of phase, close loop, or open loop. The PWM signal is then filtered by the filtering circuit 100, which is illustrated in FIG. 1. The filtering circuit 100 filters out (e.g., removes) pulses in the PWM signal that have duty cycles outside of a pre-determined range, in some embodiments. The filtered PWM signal is then sent to the PWM signal processor 203. In some embodiments, the PWM signal processor 203 is a mix-signal circuit, which adjusts the filtered PWM signal in preparation for outputting the filtered PWM signal through the PWM power stage 205. For example, functions of the PWM signal processor 203 may include, e.g., deadtime control, or adjustment of driving speed in accordance with the load 207. The output of the PWM signal processor 203 is sent to the PWM power stage 205. The PWM power stage 205 is a driver circuit, which provides power signal to the load 207 thorough, e.g., an LC circuit, where the power signal at the output of the PWM power stage 205 corresponds to the output of PWM signal processor 203, but with improved driving capability.

Figure 4:
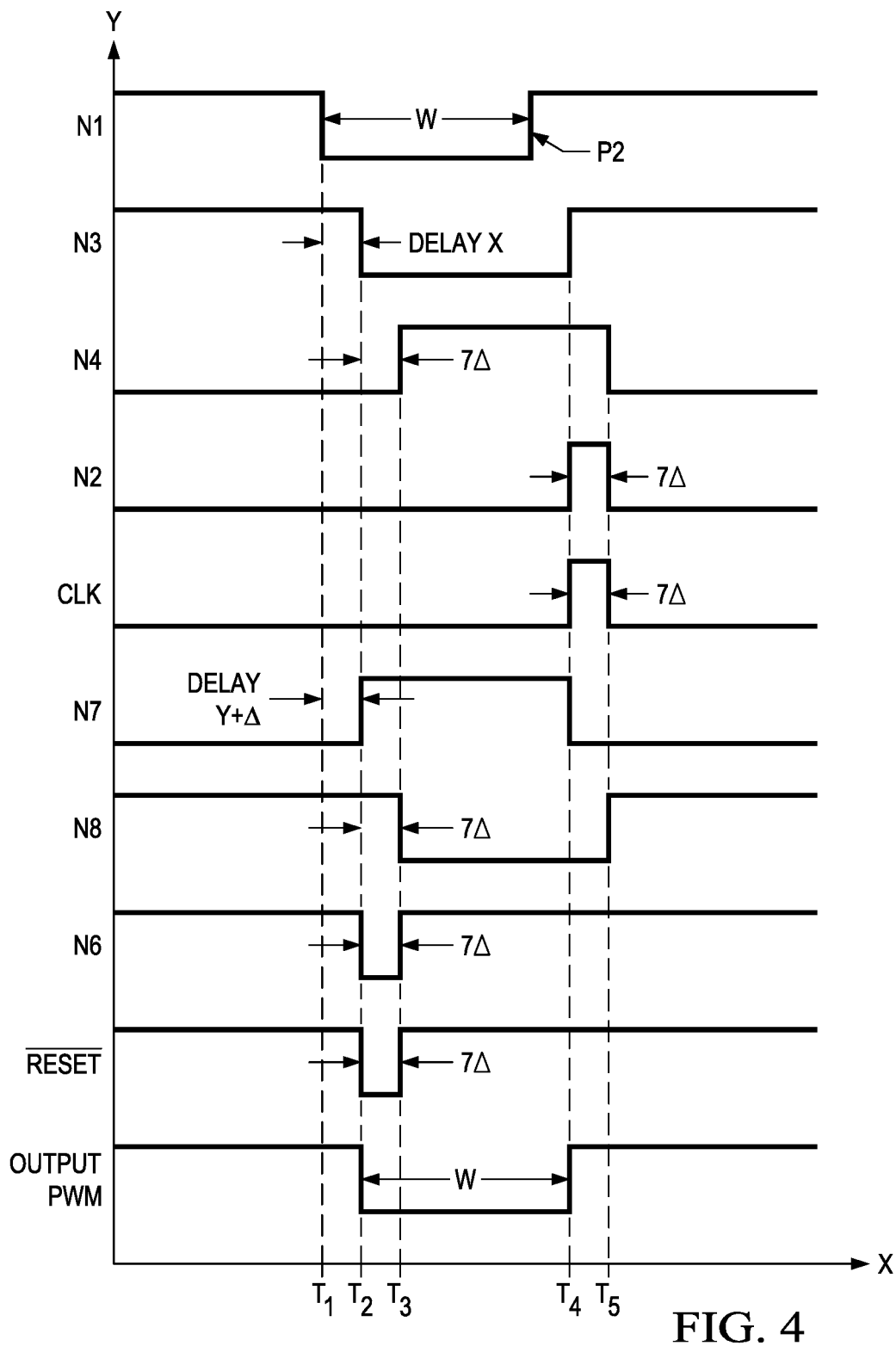
FIG. 4 is a timing diagram illustrating the filtering of a negative pulse by the filtering circuit of FIG. 1, in an embodiment.

FIGS. 3 and 4 illustrate details regarding the filtering of pulses in the PWM signal using the filtering circuit 100, which help to understand how the filtering circuit 100 filters out pulses having duty cycles outside a pre-determined range. In particular, FIG. 3 is a timing diagram illustrating the filtering of a positive pulse by the filtering circuit 100 of FIG. 1, and FIG. 4 is a timing diagram illustrating the filtering of a negative pulse by the filtering circuit 100 of FIG. 1. In some embodiments, the pulses in the input PWM signal are positive pulses. In other embodiments, the pulses in the input PWM signal are negative pulses. FIGS. 3 and 4 therefore cover the different embodiment PWM signals.

In FIGS. 3 and 4, the x-axis represents time, and the y-axis represents the amplitude (e.g., logic high or logic low) of the various signals. The name of each illustrated signal is listed on the left side of the figures along the y-axis. The signals in FIGS. 3 and 4 correspond to signals in FIG. 1 labeled with the same name. For example, in FIG. 1, the input PWM signal at the input terminal 110 is labeled as signal N1. The two input signals to the second AND gate 103 are labeled as signals N1 and N2, respectively. The output of the first circuit 108 is labeled as signal CLK, the output of the second circuit 18 is labeled as signal Reset, and the output of the filtering circuit 100 is labeled as signal Output PWM.

Referring now to FIG. 3, which shows a positive pulse P1 with a pulse width W arriving at time T1. The output of the delay line X 102, labeled as signal N3, shows a delayed version (e.g., delayed by a duration of DelayX) of the positive pulse P1 at time T2. The signal N4 at the input of the first AND gate 105 is a delayed and inverted version of the signal N3. Note that FIG. 3 shows a delay of 7Δ between the signals N3 and N4, where for simplicity, it is assumed that the inverter 107 and the buffers 109 (e.g., a total of six buffers 109 are illustrated in FIG. 1) each has a propagation delay of Δ. The delay Δ typically has a very small value, such as smaller than 100 picoseconds (ps) for complementary metal-oxide-semiconductor (CMOS) devices. The pre-determined delays (e.g., DelayX and DelayY) of the delay line X and the delay line Y, however, may have a value orders of magnitude larger, such as about 10 ns or even a few microseconds. Therefore, in order to illustrate all the delay (e.g., 7Δ, DelayX and DelayY) in the drawings, FIGS. 3 and 4 may not show the delays (e.g., 7Δ, DelayX and DelayY) in proportion. In addition, for simplicity, in the timing diagram of FIGS. 3 and 4, the propagation delays through the other logic gates or logic device (e.g., 105, 103, 119, 111, and 101) are ignored.

The signals N3 and N4 are combined through a logic AND operation by the first AND gate 105 (see FIG. 1) to produce the signal N2. As illustrated in FIG. 3, the signal N2 is a positive pulse with a pulse width of 7Δ arriving at time T2. Note that the pulse width of 7Δ is due to the total delay caused by the inverter 107 and the buffers 109. By adjusting the number of buffers 109, the width of the positive pulse of the signal N2 can be adjusted. The signal N2 and the signal N1 are combined through a logic AND operation by the second AND gate 103 to produce the signal CLK, which is illustrated in FIG. 3.

Note that when the pre-determined delay DelayX is smaller than the pulse width W of the signal N1 (DelayX<W), the signal N2 is aligned with the logic high portion of the signal N1, and as a result, the signal CLK is the same as the signal N2. In other words, when DelayX<W, the signal CLK in FIG. 3 is generated as a valid clock signal (e.g., a positive pulse having a rising-edge).

On the other hand, if the pre-determined delay DelayX is equal to or larger than the pulse width W of the signal N1 (DelayX≥W), the signal N2 would be aligned with the portion of the signal N1 having a logic low value, and therefore, the signal CLK would not be a positive pulse as illustrated in FIG. 3. Instead, the signal CLK in FIG. 3 would simply be a logic low signal (e.g., a flat line with a logic low value). Since the D flip-flop 101 expects a rising-edge effective clock signal, the signal CLK with a flat line shape is not a valid clock signal. In other words, when DelayX≥W, the signal CLK generated would be an invalid clock signal (e.g., a flat line without a rising-edge).

Still referring to FIG. 3, the signal N7 at the output of the inverter 113 is a delayed (e.g., delayed by a duration of DelayY+Δ) version of the signal N1. Note that for simplicity, in FIGS. 3 and 4, it is assumed that the inverter 113, 117, and the buffers 115 each has a propagation delay of Δ. In the illustrated example, the DelayY+Δ is chosen to be equal to DelayX (e.g., DelayY+Δ=DelayX). Since Δ may be orders of magnitude smaller than DelayX and DelayY, the above relationship may be simplified as (e.g., closely approximated by) DelayY=DelayX. As will become clear in the discussion hereinafter, such a choice produces an output PWM pulse having a pulse width W at the output terminal 104, in some embodiments.

The signal N8 is a delayed and inverted version of the signal N7, as illustrated in FIG. 3. The combination of the signals N8 and N7 by the NAND gate 119 produces the signal N6, which is a negative pulse with a pulse width of 7Δ. Similar to the discussion above regarding the signals N4 and N2, the number of buffers 115 may be adjusted to change the width of the negative pulse of the signal N6. The signal N6 and the signal N1 are then combined by the OR gate 111 to produce the signal $\overline{\text{Reset}}$, which is the same as the signal N6 in the example of FIG. 3.

Since the input terminal D of the D flip-flop 101 is coupled to a logic high signal, when the rising edge of the signal CLK arrives at time T2, the output PWM signal at the output terminal 104 turns high. When the signal $\overline{\text{Reset}}$ turns low at time T4, the output PWM signal turns low. As a result, the output PWM signal is a positive pulse, and has a same pulse width W as the input PWM signal. It is seen from FIG. 3 that by choosing DelayY+Δ=DelayX (or simplified as DelayY=DelayX), the duration between the rising edge of the signal CLK and the falling edge of the signal $\overline{\text{Reset}}$ is equal to the pulse width W, thus setting the pulse width of the output PWM signal at W.

Recall that if DelayX W, a valid clock signal CLK would not be generated. Therefore, the output PWM signal would stay at, e.g., a logic low value, and the positive pulse of the output PWM signal illustrated in FIG. 3 would not be generated. Denote the period of the input PWM signal as T, the above relationship can be rewritten as $$\frac{W}{T} \le \frac{DelayX}{T}.$$

Note that W/T is the duty cycle of the pulse of the input PWM signal. Therefore, the above relationship indicates that pulses of the input PWM signal (e.g., P1) with duty cycles smaller than or equal to DelayX/T will be filtered out (e.g., removed) by the filtering circuit 100.

FIG. 3 further illustrates a positive pulse P1' in phantom in the signal N1. The positive pulse P1' is the next positive pulse in the input PWM signal and is delayed from the positive pulse P1 by a duration of T (period of the pulses). Note that the reset signal $\overline{\text{Reset}}$ is generated by combining the signal N6 with the signal N1 using the OR gate 111. If the logic high portion of the positive pulse P1' overlaps with the logic low portion of the negative pulse of the signal N6, a valid reset signal $\overline{\text{Reset}}$ (e.g., having a negative pulse) would not be generated. As a result, the positive pulse of the output PWM signal illustrated in FIG. 3 would not be generated. From FIG. 3, it is seen that when W+DelayX+7Δ≥T, the logic high portion of the next positive pulse P1' would overlap with the logic low portion of the negative pulse of the signal N6. Rearranging the above inequality and dividing by T (the period of the PWM pulses) yields $$\frac{W}{T} \ge 1 - \frac{DelayX + 7\Delta}{T}.$$

Since Δ may be orders of magnitude smaller than DelayX, the above inequality can be simplified as $$\frac{W}{T} \ge 1 - \frac{DelayX}{T}.$$

In other words, pulses with duty cycles larger than 1−DelayX/T would be filtered out (e.g., removed) by the filtering circuit 100.

From the two inequalities discussed above, it follows that pulses of the input PWM signal having duty cycles within a pre-determined range between DelayX/T and 1−DelayX/T $$\left(\text{e.g., } \frac{DelayX}{T} < \frac{W}{T} < 1 - \frac{DelayX}{T}\right)$$

will pass through the filtering circuit 100, and pulses with duty cycles outside the pre-determined range would be filtered out (e.g., removed) from the output PWM signal. Another observation is that the pre-determined range $$\left(\text{e.g., } \frac{DelayX}{T} < \frac{W}{T} < 1 - \frac{DelayX}{T}\right)$$

is centered with respect to the full range between zero percent and one hundred percent. As a result, filtering (e.g., removing) of pulses outside the pre-determined range is symmetric with respect to a center (e.g., 50%) of the full range between zero percent and one hundred percent. For example, is DelayX/T is 2%, then pulses with duty cycles at the top 2% (e.g., between 98% and 100%) and at the bottom 2% (e.g., between 0% and 2%) are filtered out. Therefore, given the period T, the pre-determined delay DelayX (or DelayY, which is substantially the same as DelayX) of the delay line X 102 (or the delay line Y 112) determines the pre-determined range for the duty cycles. In some embodiments, the pre-determined delay DelayX (or DelayY) is adjusted to change the pre-determined range for the duty cycles of pulses that are allowed to pass through the filtering circuit 100.

FIG. 4 is a timing diagram illustrating the filtering of a negative pulse by the filtering circuit 100 of FIG. 1, in an embodiment. In FIG. 4, the input PWM signal at the input terminal 110 is a negative pulse P2, as illustrated by the signal N1. The logic operations to generate the various signals in FIG. 4 are similar to those of FIG. 3, thus details may not be repeated. Some differences between FIG. 3 and FIG. 4 are discussed herein.

Recall that in FIG. 3, the clock signal CLK is generated at time T2, before the reset signal $\overline{\text{Reset}}$ is generated at time T4. In FIG. 4, the reset signal $\overline{\text{Reset}}$ is generated at time T2, before the CLK signal CLK is generated at time T4. Therefore, in FIG. 4, the output negative pulse of the output PWM signal is generated by resetting the D flip-flop 101 at time T2, and by setting the output of the D flip-flop to logic high at time T4.

From the timing diagram of FIG. 4, it is seen that when DelayY+Δ=DelayX (or approximately DelayY=DelayX), the pulse of the output PWM signal has a same pulse width W as the pulse of the input PWM signal. In addition, if DelayX W, a valid reset signal Reset would not be generated at time T2. Further, similar to the discussion in FIG. 3, if W+DelayX+7Δ≥T, where T is the period of the pulses in the PWM signal, a valid clock signal CLK would not be generated at time T4, because the logic high portion of the signal N2 would overlap with the logic low portion of the next negative pulse in the PWM signal. Therefore, for negative pulses, we arrive at a same conclusion as FIG. 3 that, pulses of the input PWM signal (e.g., P2) having duty cycles within a pre-determined range between DelayX/T and 1−DelayX/T $$\left(\text{e.g., } \frac{DelayX}{T} < \frac{W}{T} < 1 - \frac{DelayX}{T}\right)$$

will pass through the filtering circuit 100, and pulses with duty cycles outside the pre-determined range would be filtered out (e.g., removed) from the output PWM signal. Note that to arrive at the above pre-determined range, it is assumed that the delay Δ is much smaller (e.g., orders of magnitude smaller) than DelayX.

Figure 5:
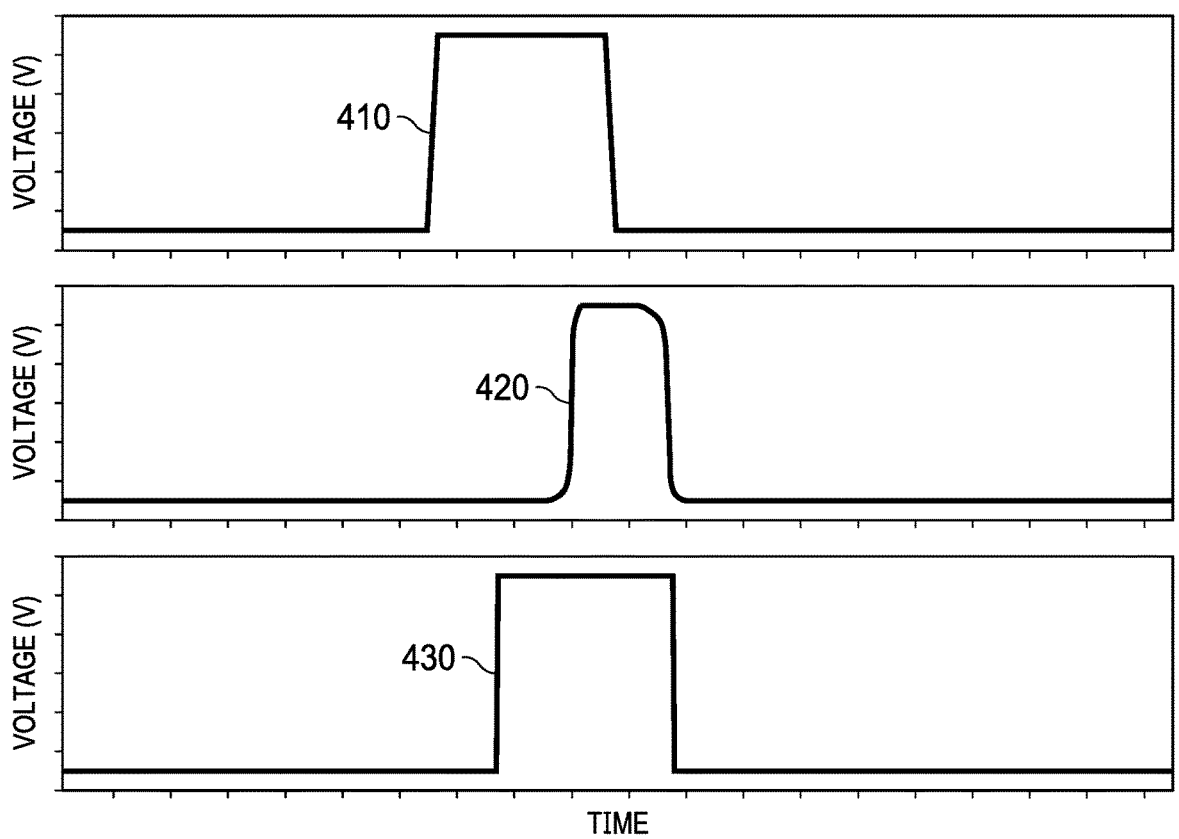
FIG. 5 illustrates various filtered PWM waveforms using the disclosed filtering circuit and a reference filtering circuit, in an embodiment.

FIG. 5 illustrates filtered PWM waveforms using the disclosed filtering circuit 100 and a reference filtering circuit, in an embodiment. In particular, waveform 410 shows a pulse of an input PWM signal, which is filtered by the reference filtering circuit and the filtering circuit 100 for comparison. Waveform 420 shows a filtered pulse using a simple RC filter as a reference filtering circuit, and waveform 430 shows a filtered pulse using the filtering circuit 100 of FIG. 1. It is seen that the waveform 420 is distorted (e.g., having a shorter pulse width) with respect to the input waveform 410. In contrast, the waveform 430 shows little or no distortion, and has a pulse width equal to that of the input waveform 410.

Figure 6:
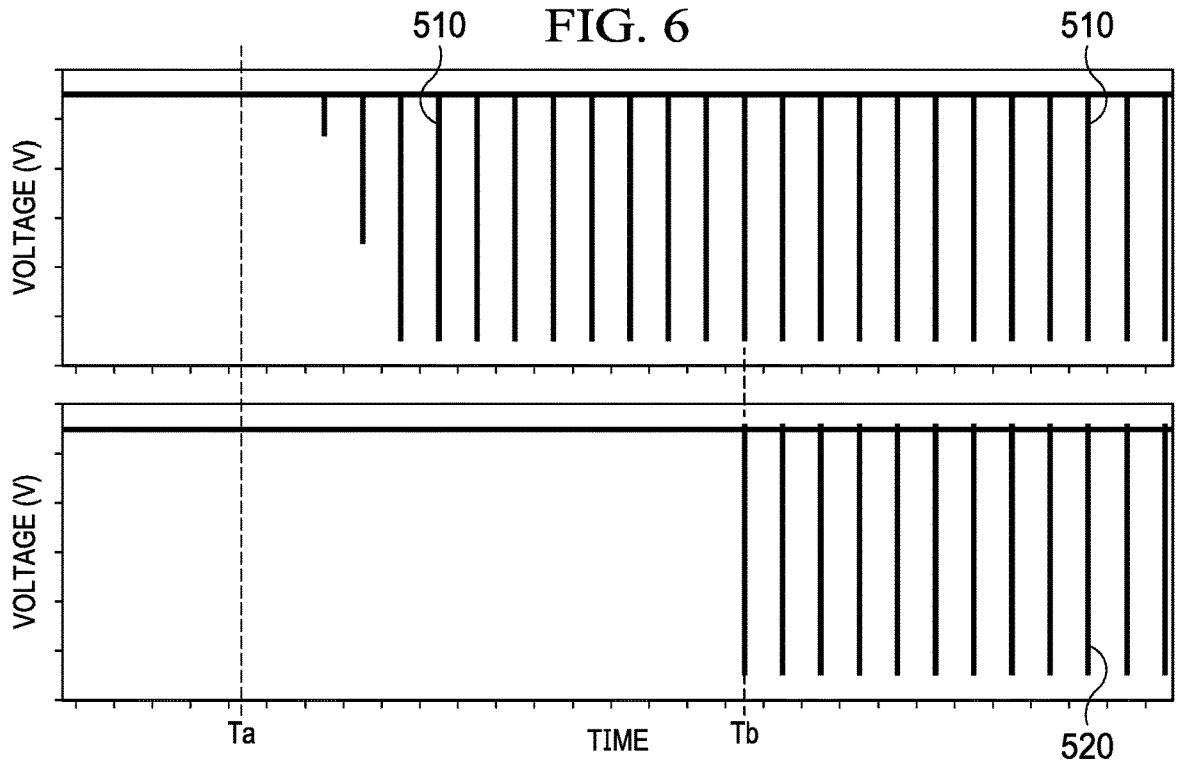
FIG. 6 illustrates the filtering of a plurality of negative pulses using the disclosed filtering circuit, in an embodiment.

FIG. 6 illustrates the filtering of a plurality of negative pulses using the disclosed filtering circuit 100, in an embodiment. The x-axis in FIG. 6 represents time, and the y-axis of the two subplots represents the amplitude of the pulses. In particular, the negative pulses 510 in the top subplot are the pulses of an input PWM signal, and the negative pulses 520 in the bottom subplot are the pulses of the output PWM signal. Due to the scale of FIG. 6, each of the pulses 510 and 520 looks like a single line. Each of the pulses 520 has a one-to-one correspondence with the negative pulse 510 directly over it. In the example of FIG. 6, duty cycles of the negative pulses 510 between time Ta and Tb are outside a pre-determined range $$\left(\text{e.g., } \frac{DelayX}{T} < \frac{W}{T} < 1 - \frac{DelayX}{T}\right),$$

and therefore, are filtered out and do not appear in the output PWM signal.

Figure 7:
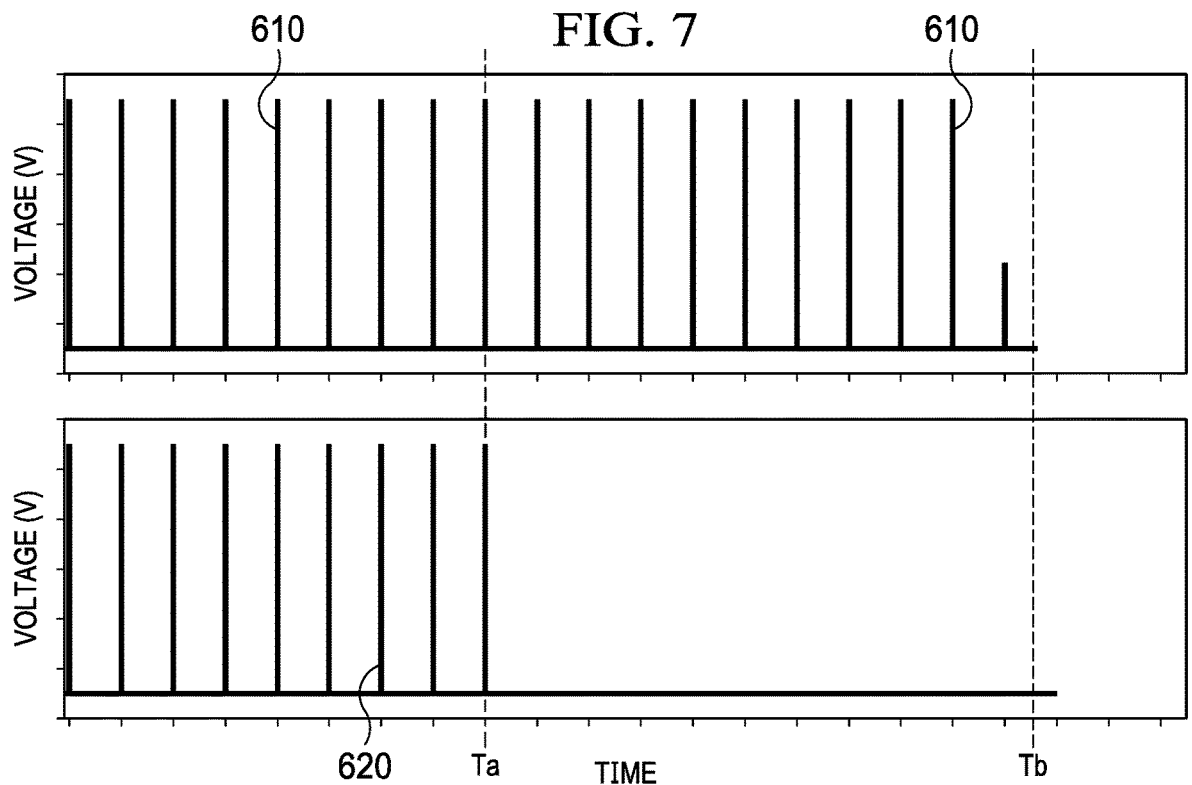
FIG. 7 illustrates the filtering of a plurality of positive pulses using the disclosed filtering circuit, in an embodiment.

FIG. 7 illustrates the filtering of a plurality of positive pulses using the disclosed filtering circuit 100, in an embodiment. The x-axis in FIG. 7 represents time, and the y-axis in the subplots represents the amplitude of the pulses. In particular, the positive pulses 610 in the top subplot are the pulses of the input PWM signal, and the positive pulses 620 in the bottom subplot are the pulses of the output PWM signal. Each of the pulses 620 has a one-to-one correspondence with the positive pulse 610 directly over it. In the example of FIG. 7, duty cycles of the positive pulses 610 between time Ta and Tb are outside a pre-determined range $$\left(\text{e.g., } \frac{DelayX}{T} < \frac{W}{T} < 1 - \frac{DelayX}{T}\right),$$

and therefore, are filtered out and do not appear in the output PWM signal.

Figure 8:
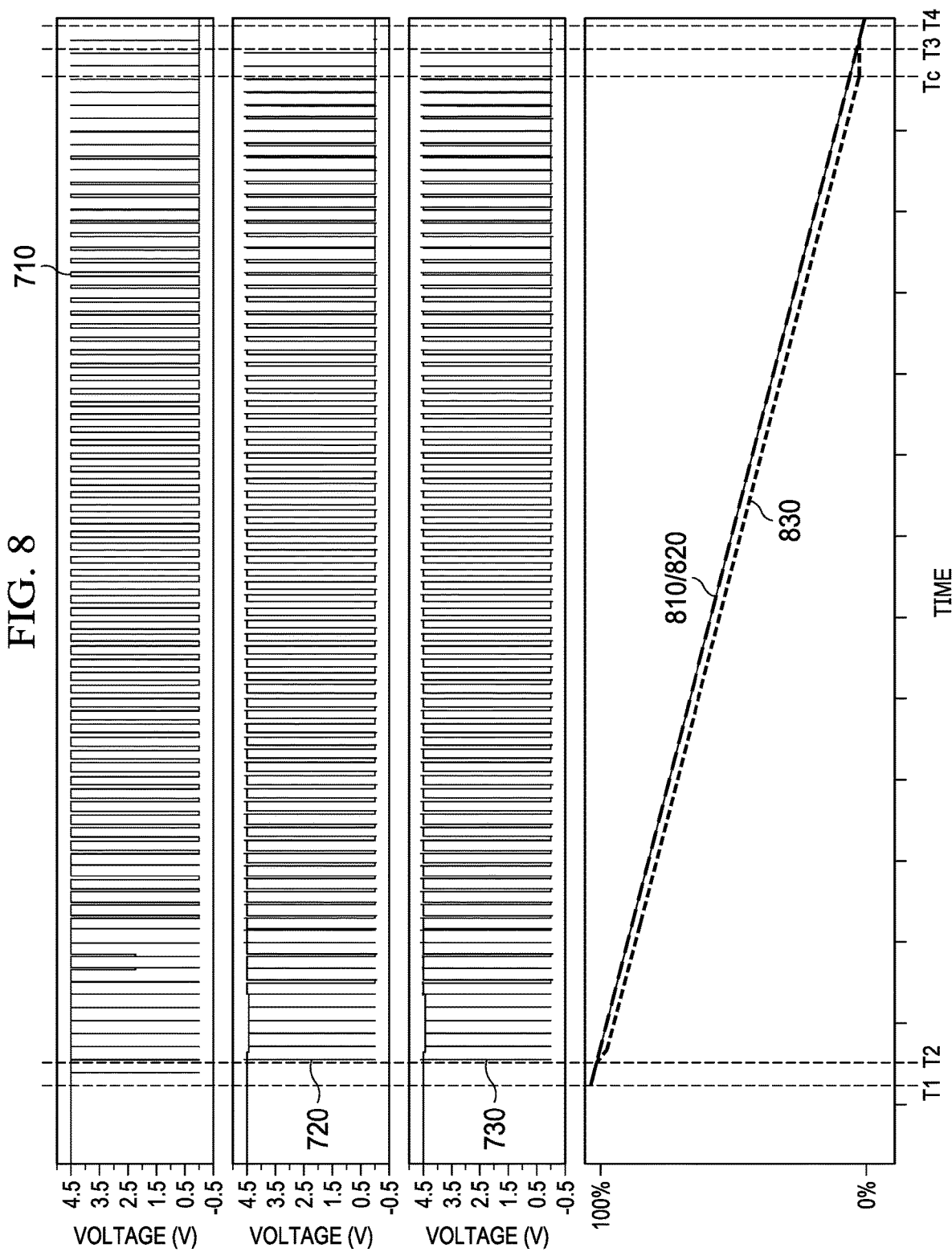
FIG. 8 illustrates the filtering of a sequence of pulses with time-varying duty cycles, in an embodiment.

FIG. 8 illustrates the filtering of a sequence of pulses with time-varying duty cycles, in an embodiment. In FIG. 8, the x-axis represents time. The y-axis represents the amplitude of the pulses for the three subplots at the top (e.g., for waveforms 710, 720 and 730), or represents the duty cycle of the filtered pulses (e.g., for curves 810, 820, 830) for the subplot at the bottom. In particular, the waveform 710 illustrates a plurality of pulses with duty cycles changing gradually from about 100% at time T1 to about 0% at time T4. The waveform 720 illustrates the corresponding filtered pulses using the filtering circuit 100 of FIG. 1. For comparison purpose, the waveform 730 illustrates the corresponding filtered pulses using a simple RC filter. The curves 810, 820, and 830 in the bottom subplot illustrate the duty cycles of the waveforms 710, 720, and 730, respectively, from time T1 to time T4.

A few observations can be made from FIG. 8. The curve 810 changes linearly from about 100% duty cycle at time T1 to about 0% duty cycle at time T4. The waveform 720 does not have filtered output pulses before time T2 or after time T3, which demonstrates the ability of the filtering circuit 100 to remove pulses having duty cycles outside a pre-determined range. In the example of FIG. 8, pulses in the waveform 710 occurring before time T2 have duty cycles larger than about 96.8%, and pulses in the waveform 710 occurring after time T3 have duty cycles lower than about 3.2%. Therefore, in the example of FIG. 8, the filtering circuit 100 passes through pulses having duty cycles within a pre-determined range (e.g., between 3.2% and 96.8%), and removes pulses outside this pre-determined range. Notice the symmetry in the pre-determined range. For example, the duty cycle at time T3 (e.g., 3.2%) and the duty cycle (e.g., 96.8) at time T2 add up to 100%. Due to the fact that little or no distortion is introduced into the filtered pulses by the filtering circuit 100, the curve 820 overlaps with the curve 810 between time T2 and time T3. Notice that the curve 810 are only drawn between time T2 and time T3, since no filtered pulses are generated outside this time period, as discussed above.

FIG. 8 further illustrates the filtered pulses in waveform 730 using an RC filter. Although in this example, the RC filter also filtered out pulses having duty cycles outside the pre-determined range, filtering of the RC filter is not precisely controlled. For example, the RC filter also removed pulses between time Tc and time T3. In addition, as illustrated by the curve 830, due to the distortion introduced by the RC filter, the duty cycles of the filtered pulses in waveform 730 using the RC filter is different from those of the input pulses in waveform 710, as indicated by the gap between the curve 810 and the curve 830. In contrast, the duty cycles of the filtered pulses in waveform 720 using the filtering circuit 100 matches almost perfectly with those of the input pulses in waveform 710, as indicated by the overlapping of the curves 810 and 820 between time T2 and time T3.

Variations to the disclosed embodiments are possible and are fully intended to be included within the scope of the present disclosure. For example, the number of buffers 109 and 115 in FIG. 1 may be adjusted to change the pulse widths of the reset signal and the clock signal. As another example, the D flip-flop 101 in FIG. 1 expects a rising-edge effective clock signal and a low effective reset signal. This is merely a non-limiting example. The D flip-flop 101 may expect other types of clock signal and reset signal, in which case simple logic gates (e.g., inverters) may be used to change the polarity or the direction of the pulses to match the expectation of the D flip-flop 101. In addition, although a D flip-flop 101 is used in the example of FIG. 1, this is merely illustrative and non-limiting. One skilled in the art will appreciate that the D flip-flop 101 may be replaced by other suitable logic devices serving a same or similar function, such as a register.

Figure 9:
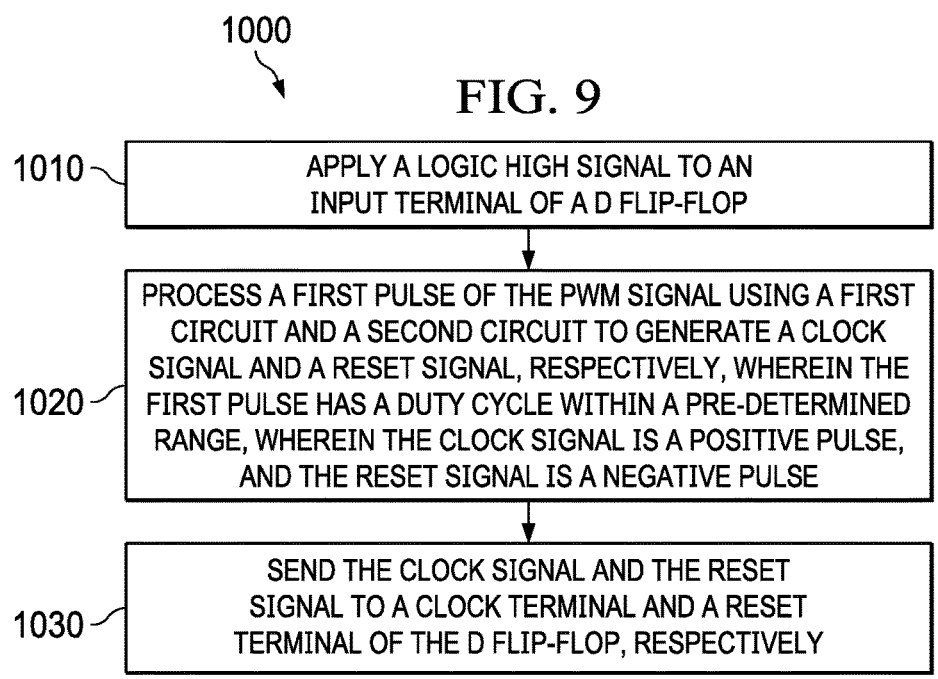
FIG. 9 illustrates a flow chart of a method of filtering a PWM signal, in some embodiments.

FIG. 9 illustrates a flow chart of a method of filtering a PWM signal, in some embodiments. It should be understood that the embodiment method shown in FIG. 9 is merely an example of many possible embodiment methods. One of ordinary skill in the art would recognize many variations, alternatives, and modifications. For example, various steps as illustrated in FIG. 9 may be added, removed, replaced, rearranged and repeated.

Referring to FIG. 9, at step 1010, a logic high signal is applied to an input terminal of a D flip-flop. At step 1020, a first pulse of the PWM signal is processed using a first circuit and a second circuit to generate a clock signal and a reset signal, respectively, wherein the first pulse has a duty cycle within a pre-determined range, wherein the clock signal is a positive pulse, and the reset signal is a negative pulse. At step 1030, the clock signal and the reset signal are sent to a clock terminal and a reset terminal of the D flip-flop, respectively.

Embodiments may achieve advantages. For example, the disclosed filtering circuit 100 filters out (e.g., removes) pulses of a PWM signal having duty cycles outside a pre-determined range, thus removing pulses that may cause failure in set/resetting registers. Little or no distortion is introduced in the filtered pulses by the filtering circuit 100, which is advantageous for applications (e.g., high frequency class-D amplifier with PWM signal having frequencies of a few megahertz (MHz), such as 2 MHz or more) sensitive to distortions in the pulse shape. The pre-determined range for the duty cycles can be easily adjusted by adjusting the pre-determined delay (e.g., DelayX) of the delay line in the filtering circuit 100. The filtering circuit 100 may be implemented using full digital cells, which may minimize the variation spread. The filtering circuit 100 may be implemented without a high speed clock. For example, the filtering circuit 100 may only include the logic gates, delay lines that could be operated without using an external high speed clock. Precise control of the filtering function of the filtering circuit is achieved, and the good noise immunity is also achieved.

Example embodiments of the present invention are summarized here. Other embodiments can also be understood from the entirety of the specification and the claims filed herein.

Example 1. A filtering circuit for filtering a pulse width modulated (PWM) signal, the filtering circuit includes: a D flip-flop, an input terminal of the D flip-flop configured to be coupled to a logic high signal, an output terminal of the D flip-flop coupled to an output terminal of the filtering circuit; and a circuit coupled between an input terminal of the filtering circuit and the D flip-flop, the circuit configured to, for a first pulse of the PWM signal having a duty cycle within a pre-determined range: generate a positive pulse at a clock terminal of the D flip-flop as a clock signal of the D flip-flop; and generate a negative pulse at a reset terminal of the D flip-flop as a reset signal of the D flip-flop, wherein a duration between a rising edge of the positive pulse and a falling edge of the negative pulse is equal to a duration of the first pulse of the PWM signal.

Example 2. The filtering circuit of example 1, wherein the D flip-flop is configured to generate an output pulse at the output terminal of the D flip-flop using the clock signal and the reset signal, the output pulse corresponding to the first pulse of the PWM signal and having a same duration as the first pulse.

Example 3. The filtering circuit of example 2, wherein the circuit is configured to, for a second pulse of the PWM signal having a duty cycle outside the pre-determined range: stop generating the positive pulse or stop generating the negative pulse, thereby preventing the D flip-flop from generating an output pulse corresponding to the second pulse of the PWM signal.

Example 4. The filtering circuit of example 1, wherein the pre-determined range is substantially centered with respect to a full range between a zero percent duty cycle and a one hundred percent duty cycle.

Example 5. The filtering circuit of example 1, wherein the clock signal of the D flip-flop is rising-edge effective, and the reset signal of the D flip-flop is low effective.

Example 6. The filtering circuit of example 1, wherein the PWM signal comprises a first plurality of positive pulses having duty cycles within the pre-determined range, wherein for each of the first plurality of positive pulses: the clock signal of the D flip-flop is generated by the circuit before the reset signal of the D flip-flop is generated by the circuit.

Example 7. The filtering circuit of example 1, wherein the PWM signal comprises a first plurality of negative pulses, wherein for each of the first plurality of negative pulses: the clock signal of the D flip-flop is generated by the circuit after the reset signal of the D flip-flop is generated by the circuit.

Example 8. The filtering circuit of example 1, wherein the circuit comprises: a first delay line with a first pre-determined delay, an input of the first delay line coupled to the input terminal of the filtering circuit; a first inverter, an input of the first inverter coupled to an output of the first delay line; a first AND gate, a first input of the first AND gate coupled to an output of the first inverter, a second input of the first AND gate coupled to the output of the first delay line; and a second AND gate, a first input of the second AND gate coupled to an output of the first AND gate, a second input of the second AND gate coupled to the input terminal of the filtering circuit, and an output of the second AND gate coupled to the clock terminal of the D flip-flop.

Example 9. The filtering circuit of example 8, wherein the circuit further comprises one or more buffers coupled between the output of the first inverter and the first input of the first AND gate.

Example 10. The filtering circuit of example 8, wherein the circuit further comprises: a second delay line with a second pre-determined delay, an input of the second delay line coupled to the input terminal of the filtering circuit; a second inverter, an input of the second inverter coupled to an output of the second delay line; a third inverter, an input of the third inverter coupled to an output of the second inverter; an NAND gate, a first input of the NAND gate coupled to an output of the second inverter, a second input of the NAND gate coupled to an output of the third inverter; and an OR gate, a first input of the OR gate coupled to an output of the NAND gate, a second input of the OR gate coupled to the input terminal of the filtering circuit, and an output of the OR gate coupled to the reset terminal of the D flip-flop.

Example 11. The filtering circuit of example 10, wherein the circuit further comprises one or more buffers coupled between the output of the second inverter and the input of the third inverter.

Example 12. A filtering circuit for filtering a pulse width modulated (PWM) signal, the filtering circuit includes: a D flip-flop and a first circuit coupled between an input terminal of the filtering circuit and an input clock terminal of the D flip-flop, wherein the first circuit comprises: a first delay line; a first inverter; a first AND gate; and a second AND gate, wherein the first delay line is coupled between the input terminal of the filtering circuit and the first inverter, the first inverter is coupled between the first delay line and a first input of the first AND gate, and a second input of the first AND gate is coupled to an output of the first delay line, wherein a first input of the second AND gate is coupled to the input terminal of the filtering circuit, a second input of the second AND gate is coupled to an output of the first AND gate, and an output of the second AND gate is coupled to the input clock terminal of the D flip-flop. The filtering circuit further includes a second circuit coupled between the input terminal of the filtering circuit and a reset terminal of the D flip-flop, wherein the second circuit comprises: a second delay line; a second inverter; a third inverter; an NAND gate; and an OR gate, wherein the second delay line is coupled between the input terminal of the filtering circuit and the second inverter, the third inverter is coupled between the second inverter and a first input of the NAND gate, and a second input of the NAND gate is coupled to an output of the second inverter, wherein a first input of the OR gate is coupled to the input terminal of the filtering circuit, a second input of the OR gate is coupled to an output of the NAND gate, and an output of the OR gate is coupled to the reset terminal of the D flip-flop.

Example 13. The filtering circuit of example 12, wherein an input terminal of the D flip-flop is configured to be coupled to a logic high signal.

Example 14. The filtering circuit of example 13, wherein the input clock terminal of the D flip-flop is configured to accept a clock signal with an effective rising-edge, and the reset terminal of the D flip-flop is configured to accept a reset signal with an effect low voltage level.

Example 15. The filtering circuit of example 13, wherein the first circuit further comprises one or more buffers, wherein the one or more buffer are coupled in series between the first inverter and the first input of the first AND gate.

Example 16. The filtering circuit of example 13, wherein the second circuit further comprises one or more buffers, wherein the one or more buffer are coupled in series between the second inverter and the third inverter.

Example 17. A method of filtering a pulse width modulated (PWM) signal, the method includes: applying a logic high signal to an input terminal of a D flip-flop; processing a first pulse of the PWM signal using a first circuit and a second circuit to generate a clock signal and a reset signal, respectively, wherein the first pulse has a duty cycle within a pre-determined range, wherein the clock signal is a positive pulse, and the reset signal is a negative pulse; and sending the clock signal and the reset signal to a clock terminal and a reset terminal of the D flip-flop, respectively.

Example 18. The method of example 17, further comprising: generating, by the D flip-flop, an output signal at an output terminal of the D flip-flop, the output signal having a same pulse width as the first pulse of the PWM signal.

Example 19. The method of example 18, further comprising: processing a second pulse of the PWM signal using the first circuit and the second circuit to generate a first signal and a second signal, respectively, wherein the second pulse has a duty cycle outside the pre-determined range, wherein the first circuit is configured to stop generating the clock signal when the second pulse is a positive pulse, and the second circuit is configured to stop generating the reset signal when the second pulse is a negative pulse; and sending the first signal and the second signal to the clock terminal and the reset terminal of the D flip-flop, respectively.

Example 20. The method of example 19, wherein the D flip-flop is configured not to generate a pulse at the output terminal of the D flip-flop in response to the first signal and the second signal.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A filtering circuit for filtering a pulse width modulated (PWM) signal, the filtering circuit comprising:
    a D flip-flop, an input terminal of the D flip-flop configured to be coupled to a reference voltage, an output terminal of the D flip-flop coupled to an output terminal of the filtering circuit; and
    a circuit coupled between an input terminal of the filtering circuit and the D flip-flop, the circuit configured to, for a first pulse of the PWM signal having a first duty cycle:
        generate a clock signal for the D flip-flop; and
        generate a reset signal for the D flip-flop, wherein the D flip-flop is configured to generate a first output pulse corresponding to the first pulse of the PWM signal when the first duty cycle is within a pre-determined range, and wherein the D flip-flop is configured not to generate an output pulse corresponding to the first pulse of the PWM signal when the first duty cycle is outside the pre-determined range.

2. The filtering circuit of claim 1, wherein a duration of the first output pulse is a same as a duration of the first pulse.

3. The filtering circuit of claim 1, wherein the pre-determined range is substantially centered within a range between a zero percent duty cycle and a one hundred percent duty cycle.

4. The filtering circuit of claim 1, wherein the input terminal of the D flip-flop is configured to be coupled to a logic high signal, the clock signal for the D flip-flop is rising-edge effective, and the reset signal for the D flip-flop is low effective.

5. The filtering circuit of claim 4, wherein the circuit is configured to not generate the clock signal when the first duty cycle is below the pre-determined range.

6. The filtering circuit of claim 5, wherein the circuit is configured to not generate the reset signal when the first duty cycle is above the pre-determined range.

7. The filtering circuit of claim 4, wherein the first pulse of the PWM signal is a positive pulse, wherein the clock signal for the D flip-flop is generated by the circuit before the reset signal for the D flip-flop is generated by the circuit.

8. The filtering circuit of claim 4, wherein the first pulse of the PWM signal is a negative pulse, wherein the clock signal for the D flip-flop is generated by the circuit after the reset signal for the D flip-flop is generated by the circuit.

9. The filtering circuit of claim 1, wherein the circuit comprises:
  a first delay line with a first pre-determined delay, an input of the first delay line coupled to the input terminal of the filtering circuit;
  a first inverter, an input of the first inverter coupled to an output of the first delay line;
  a first AND gate, a first input of the first AND gate coupled to an output of the first inverter, a second input of the first AND gate coupled to the output of the first delay line; and
  a second AND gate, a first input of the second AND gate coupled to an output of the first AND gate, a second input of the second AND gate coupled to the input terminal of the filtering circuit, and an output of the second AND gate coupled to a clock terminal of the D flip-flop.

10. The filtering circuit of claim 9, wherein the circuit further comprises one or more buffers coupled between the output of the first inverter and the first input of the first AND gate.

11. The filtering circuit of claim 9, wherein the circuit further comprises:
  a second delay line with a second pre-determined delay, an input of the second delay line coupled to the input terminal of the filtering circuit;
  a second inverter, an input of the second inverter coupled to an output of the second delay line;
  a third inverter, an input of the third inverter coupled to an output of the second inverter;
  an NAND gate, a first input of the NAND gate coupled to an output of the second inverter, a second input of the NAND gate coupled to an output of the third inverter; and
  an OR gate, a first input of the OR gate coupled to an output of the NAND gate, a second input of the OR gate coupled to the input terminal of the filtering circuit, and an output of the OR gate coupled to a reset terminal of the D flip-flop.

12. The filtering circuit of claim 11, wherein the circuit further comprises one or more buffers coupled between the output of the second inverter and the input of the third inverter.

13. A power system comprising:
  a pulse width modulated (PWM) modulator configured to generate a plurality of PWM pulses;
  a PWM filter, wherein an input of the PWM filter is electrically coupled to an output of the PWM modulator, wherein the PWM filter comprises:
    a D flip-flop, wherein an input terminal of the D flip-flop is configured to be coupled to a reference voltage, and an output terminal of the D flip-flop is coupled to an output of the PWM filter; and
    a circuit coupled between the input of the PWM filter and the D flip-flop; and
  a PWM signal processor, wherein the output of the PWM filter is electrically coupled to an input of the PWM signal processor, wherein the PWM filter is configured to:
    pass through a first pulse of the plurality of PWM pulses to the output of the PWM filter, wherein a first duty cycle of the first pulse is within a pre-determined range, wherein the circuit of the PWM filter is configured to, for the first pulse of the plurality of PWM pulses:
      generate a clock signal for the D flip-flop; and
      generate a reset signal for the D flip-flop, wherein the D flip-flop is configured to generate a first output pulse corresponding to the first pulse at the output terminal of the D flip-flop, the first output pulse having a same duration as the first pulse of the plurality of PWM pulses; and
    remove a second pulse of the plurality of PWM pulses from the output of the PWM filter, wherein a second duty cycle of the second pulse is outside the pre-determined range.

14. The power system of claim 13, further comprising a PWM power circuit, wherein the PWM power circuit comprises a driver circuit, and an input of the PWM power circuit is coupled to an output of the PWM signal processor.

15. The power system of claim 13, wherein the circuit is configured to, for the second pulse of the plurality of PWM pulses, not generate the clock signal or not generate the reset signal such that no output pulse corresponding to the second pulse is generated at the output terminal of the D flip-flop.

16. A method of filtering a pulse width modulated (PWM) signal, the method comprising:
  applying a reference voltage to an input terminal of a D flip-flop;
  processing the PWM signal using a first circuit and a second circuit, wherein the PWM signal comprises a first PWM pulse having a first duty cycle within a pre-determined range and comprises a second PWM pulse having a second duty cycle outside the pre-determined range, wherein processing the PWM signal comprises:
    generating, for the first PWM pulse, a clock signal at a first output terminal of the first circuit and a reset signal at a second output terminal of the second circuit; and
    stop generating, for the second PWM pulse, the clock signal at the first output terminal or the reset signal at the second output terminal; and
  sending outputs at the first output terminal and the second output terminal to a clock terminal and a reset terminal of the D flip-flop, respectively.

17. The method of claim 16, wherein the reference voltage is a logic high signal, the clock signal is a positive pulse, and the reset signal is a negative pulse.

18. The method of claim 16, wherein the first circuit is configured to stop generating the clock signal when the second PWM pulse is a positive pulse.

19. The method of claim 18, wherein the second circuit is configured to stop generating the reset signal when the second PWM pulse is a negative pulse.

* * * * *